United States Patent
Ikeda (10) Patent No.: US 7,804,347 B2
(45) Date of Patent: Sep. 28, 2010

(54) PULSE GENERATOR CIRCUIT AND COMMUNICATION APPARATUS

(75) Inventor: Masayuki Ikeda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 71 days.

(21) Appl. No.: 12/394,817

(22) Filed: Feb. 27, 2009

(65) Prior Publication Data

US 2009/0219064 A1    Sep. 3, 2009

(30) Foreign Application Priority Data

Mar. 3, 2008    (JP)    ............................. 2008-051707
Jan. 5, 2009    (JP)    ............................. 2009-000064

(51) Int. Cl.
    *G06F 1/04*    (2006.01)
(52) U.S. Cl. ...................... 327/291; 327/295
(58) Field of Classification Search ................. 327/291, 327/299
    See application file for complete search history.

(56) References Cited

U.S. PATENT DOCUMENTS 6,421,389 B1    7/2002    Jett et al.
7,449,932 B2 *  11/2008   Ikeda ........................ 327/291
7,719,338 B2 *   5/2010   Ikeda ........................ 327/291
2001/0033576 A1 10/2001   Richards
2003/0108133 A1  6/2003   Richards

OTHER PUBLICATIONS

Barajas et al., "A Low-Power Template Generator for Coherent Impulse-Radio Ultra Wide-Band Receivers," *Proceedings IEEE ICUWB*, 2006, pp. 97-102.

* cited by examiner

*Primary Examiner*—Hai L Nguyen
(74) *Attorney, Agent, or Firm*—Oliff & Berridge, PLC (57) ABSTRACT

A pulse generator circuit that outputs pulses having a predetermined shape from an output terminal based on a start signal includes a timing generator circuit that generates (n) signals (n is an integer greater than or equal to 2), a pulse width signal generator circuit that generates a first pulse width signal and a second pulse width signal a first filter circuit limiting the band of the first pulse width signal, a second filter circuit limiting the band of the second pulse width signal, first and second power supplies, a first variable impedance circuit controlled by the first filter circuit, a second variable impedance circuit controlled by the second filter circuit, and a switching circuit that alternately connects the output terminal to the first power supply using a logic function value based on at least part of the n signals.

5 Claims, 11 Drawing Sheets

PULSE GENERATOR CIRCUIT AND COMMUNICATION APPARATUS

BACKGROUND

1. Technical Field

The present invention relates to a pulse generator circuit that generates pulses suitable for UWB (Ultra Wide Band) communication, and also relates to a communication apparatus.

2. Related Art

UWB communication is a high-speed, large-capacity data communication method using an ultra-wide frequency band. Other examples of the communication method using a wideband signal include conventional spectrum spreading and orthogonal frequency division multiplexing (OFDM). On the other hand, UWB is a wider band communication method using ultra-short pulses, and also called an impulse radio (IR) communication, which is hereinafter referred to as a UWB-IR method or simply referred to as an IR method. In the IR method, only time-base operation, which is not based on conventional modulation, allows modulation and demodulation, and it is expected that the circuitry is simplified and the power consumption is reduced (see U.S. Pat. No. 6,421,389, United States Patent Application Publication No. 2003/0,108,133 A1, and United States Patent Application Publication No. 2001/0,033,576).

Figure 9A:
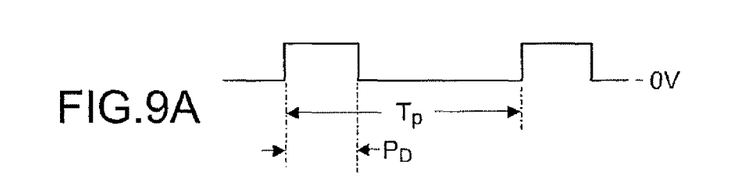
FIGS. 9A to 9G explain pulses generated in the present embodiment.

The pulse waveform used in the IR method will be briefly described below with reference to the drawings. A pulse train having a pulse width $P_D$ and a cycle $T_P$ shown in FIG. 9A is well known, and the frequency spectrum of the pulse train is a sinc function the envelope of which has a first zero point at a frequency $B_W=1/P_D$, as shown in FIG. 9B.

Figure 9B:
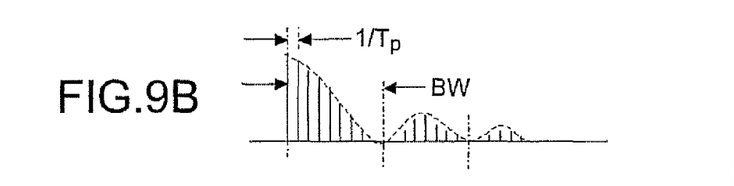
Figure 9C:
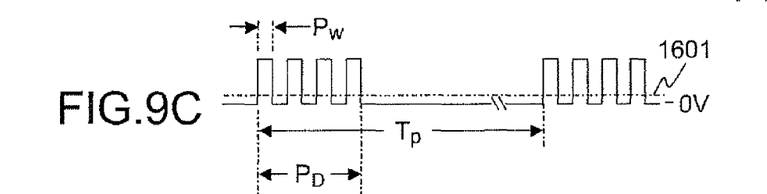
Figure 9D:
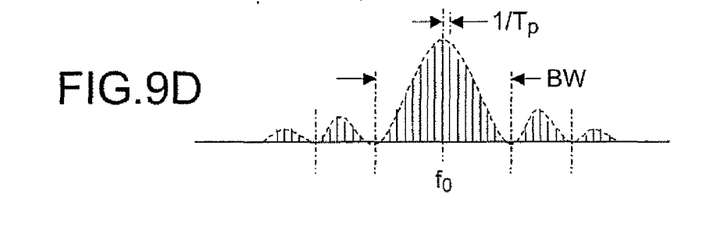

The pulses shown in FIG. 9B are not easy to use because the spectrum spans DC to BW, whereas pulses shown in FIG. 9D, in which the carrier frequency $f_0$ at the center of the spectrum is on the high frequency side, are preferable. The pulse waveform is obtained by clipping the portions of a rectangular wave having a frequency $f_0=1/(2P_W)$ that correspond to the pulses in FIG. 9A and moving them toward the high frequency side of the frequency spectrum. The waveform, however, contains a DC component indicated by the dashed line 1601 in FIG. 9C, and does not have the ideal spectrum shown in FIG. 9D in the exact sense.

Figure 9E:
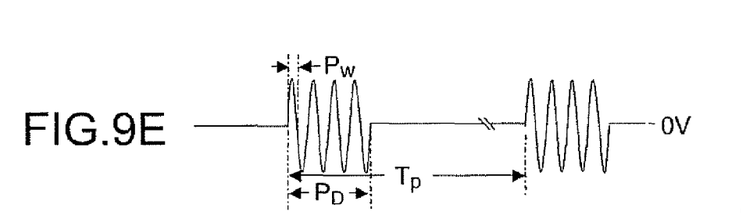
Figure 9F:
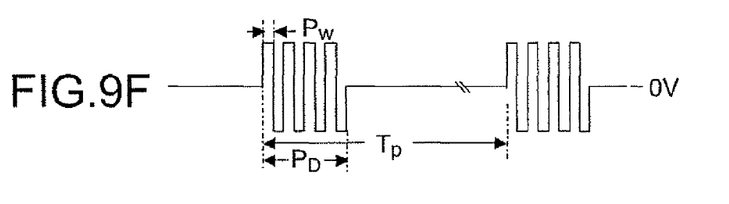

A waveform having the ideal spectrum is shown in FIG. 9E. The waveform is obtained by multiplying the pulses shown in FIG. 9A by a sinusoidal wave having the carrier frequency $f_0$. FIG. 9F shows a waveform obtained by multiplying the pulses shown in FIG. 9A by a rectangular wave having the carrier frequency $f_0$, and the waveform is readily generated by a digital circuit. Since an actual digital circuit has a narrow pulse width, such a square-cornered waveform will not be generated, but the waveform shown in FIG. 9E will be obtained. When the waveform shown in FIG. 9C is used to drive an antenna, the DC component will not be radiated from the antenna, and a signal the waveform of which is close to the waveform shown in FIG. 9F will be radiated.

Other pulse waveforms ideal for the UWB communication have been invented, and Gaussian pulses and Hermitian pulses are believed to be suitable. Although different from the waveforms shown in FIGS. 9A to 9G, these pulses are frequently used because they are readily generated.

Figure 9G:
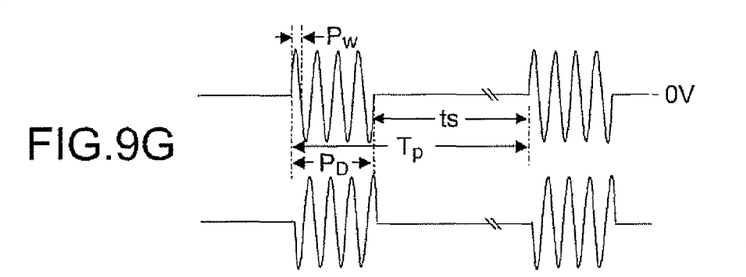

In the UWB communication, the thus generated pulses are used not only in a transmitter, but also in a receiver as template pulses for evaluating correlation with a received signal. In the receiver, differential signal processing is often carried out, and two signals having phases inverted from each other shown in FIG. 9G are often required. The differential pulse signals are also effective in the transmitter, for example, when a balanced antenna is driven. In the receiver circuit, what is called IQ signals, in which the phase of the in-phase signal differs from the phase of the quadrature signal by 90 degrees, is further required in many cases.

For example, "A Low-Power Template Generator for Coherent Impulse-Radio Ultra Wide-Band Receivers," Jose Luis et al, Proceedings IEEE ICUWB, 2006, pp. 97-102 presents a circuit for generating balanced pulses. The circuit, which has several differential delay circuits connected in tandem, generates a pulse train having a pulse width that corresponds to the amount of delay generated in a single delay circuit based on a logic circuit. "A Low-Power Template Generator for Coherent Impulse-Radio Ultra Wide-Band Receivers," Jose Luis et al, Proceedings IEEE ICUWB, 2006, pp. 97-102 suggests the possibility of reduction in power consumption by carrying out a pulse startup operation both in rise and fall portions of a signal inputted to the delay circuits, as well as the possibility of IQ signal generation by using every other delay circuit.

The pulse generator circuit of the related art described above having a simple circuit configuration can accurately generate ultra-high-frequency, ultra-wideband pulses necessary for UWB communication, and the generated fine pulses are substantially circuit constituent device performance limited.

As described with reference to FIGS. 9A to 9G, however, the spectral characteristics of the pulses generated by the circuit of the related art follow a sinc function, and hence suffer from a significantly broad side lobe. To use the pulses generated by the circuit in communication applications, the pulses need to be band-limited in some way. In the related art, a filter is used to band-limit the pulses. A problem with the filter is that the filter should be a bandpass filter that works at an ultra-wideband, ultra-high frequency that is close to the device performance limit and has good skirt characteristics and such a configuration is not easy to achieve.

SUMMARY

An advantage of some aspects of the invention is to solve at least part of the problems described above, and the invention can be embodied in the following forms or applications.

First Application

A first application of the invention provides a pulse generator circuit that outputs pulses having a predetermined shape from an output terminal based on a start signal, the pulse generator circuit including a timing generator circuit that generates (n) signals (n is an integer greater than or equal to 2), the phases of which sequentially change at predetermined time intervals from the point when the phase of the start signal changes, a pulse width signal generator circuit that generates a first pulse width signal and a second pulse width signal having a pulse width that corresponds to the duration of the pulses to be generated based on the start signal, a first filter circuit to which the first pulse width signal is inputted, the first filter circuit limiting the band of the first pulse width signal, a second filter circuit to which the second pulse width signal is inputted, the second filter circuit limiting the band of the second pulse width signal, first and second power supplies that supply predetermined potentials, a first variable impedance circuit whose impedance value is controlled by the output value from the first filter circuit, a second variable impedance circuit whose impedance value is controlled by the output value from the second filter circuit, and a switching circuit that alternately connects the output terminal to the first power supply via the first variable impedance circuit or the second power supply via the second variable impedance circuit using a logic function value based on at least part of the n signals.

According to the above configuration, the envelope of the output pulses is the output waveform generated by the first or second filter circuit, and the output pulses can be band-limited. In such a configuration, the band-limiting filter circuit can be a lowpass filter. Additionally, the frequency handled by the lowpass filter is approximately one-half the reciprocal of the pulse duration, and much lower than the central frequency of the output pulses. The above configuration does not require a bandpass filter that handles a high operating frequency band centered around the central frequency of the output pulses, unlike the band limitation in related art. Therefore, the configuration is simple and provides stable, accurate pulses.

Second Application

In the pulse generator circuit described above, the timing generator circuit includes delay circuits connected in tandem, each of the delay circuits generating a predetermined amount of delay.

According to the above configuration, it is possible to supply a circuit that can be readily configured in a semiconductor integrated circuit.

Third Application

In the pulse generator circuit described above, the timing generator circuit is comprised of a ring oscillator circuit at least part of which including a delay circuit that generates a predetermined amount of delay.

According to the above configuration, it is possible to supply a circuit that can be readily configured in a semiconductor integrated circuit. It is further possible to repeatedly use a logic circuit that evaluates a logic function using the n signals and the switching circuit, whereby the pulse generator circuit can be formed of a reduced number of devices even when a long pulse train is generated.

Fourth Application

In the pulse generator circuit described above, the first variable impedance circuit is comprised of a transistor controlled by the output value from the first filter circuit, and the second variable impedance circuit is comprised of a transistor controlled by the output value from the second filter circuit.

According to the above configuration, each of the first and second variable impedance circuits can be comprised of a transistor, and hence can be readily comprised of an integrated circuit, advantageously resulting in size reduction, high reliability, and cost reduction of the apparatus.

Fifth Application

A fifth application of the invention provides a communication apparatus including the pulse generator circuit described above.

According to the above configuration, significantly fine, accurate pulses specific to UWB can be readily generated. Therefore, using the pulse generator circuit as a template generator circuit in a modulation circuit or a demodulation circuit allows a stable circuit system to be employed and a stable, highly-reliable, highly-sensitive apparatus to be configured at a low cost. Further, the present pulse generator circuit can generate high-frequency, accurate pulses close to the performance limit of the devices. The present configuration is therefore quite useful. Moreover, the present pulse generator circuit can be formed in a CMOS integrated circuit or any other suitable circuit, and can generate an accurate pulse waveform in a simple circuit even when the pulse waveform is formed of fine pulses on the order of the operating transition period of the devices. Further, since the present pulse generator circuit can be configured by a logic circuit using a CMOS integrated circuit, the pulse generator circuit can readily operate at the highest speed of the CMOS integrated circuit without increase in operating power. It is therefore possible to readily generate high-frequency, wideband pulses useable in UWB communication.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Embodiments of a pulse generator circuit will be described below with reference to the drawings.

First Embodiment

Configuration of Pulses to be Generated

Pulses to be generated in the present embodiment will first be described with reference to FIGS. 9A-9G to FIG. 15. The pulses to be generated are single-ended output pulses shown in FIGS. 9E and 9F, or a pair of band-limited pulses having phases different from each other by 180 degrees shown in FIG. 9G. The waveform of the band-limited pulses will be described later in more detail with reference to FIGS. 10 to 15. FIG. 9G shows differential output pulse signals, and the potential difference between the outputs is equal to the waveform shown in FIG. 9E. Looking at the output potential difference as the differential signals, one can set the DC level during the no-pulse period indicated by ts shown in FIG. 9G to an arbitrary value as long as it is fixed.

The present embodiment will be described with reference to, by way of example, generation of the waveform having the following specifications, which are readily achievable by using minimum width 0.18μ CMOS (Complementary Metal Oxide Semiconductor) processes.

Pulse interval: $T_p$=arbitrary value
Carrier frequency: $f_0$=4 GHz
Carrier pulse width: $P_W$=125 psec
Pulse width: $P_D$=arbitrary value
The number of pulses contained in the period $P_D$ (the number of fingers): arbitrary value ($P_D$=(the number of fingers× 2−1)×$P_W$)
Signal form: single-ended output, differential output, and a pair of differential output IQ signals The invention is, however, not limited to the above cases.

Figure 10:
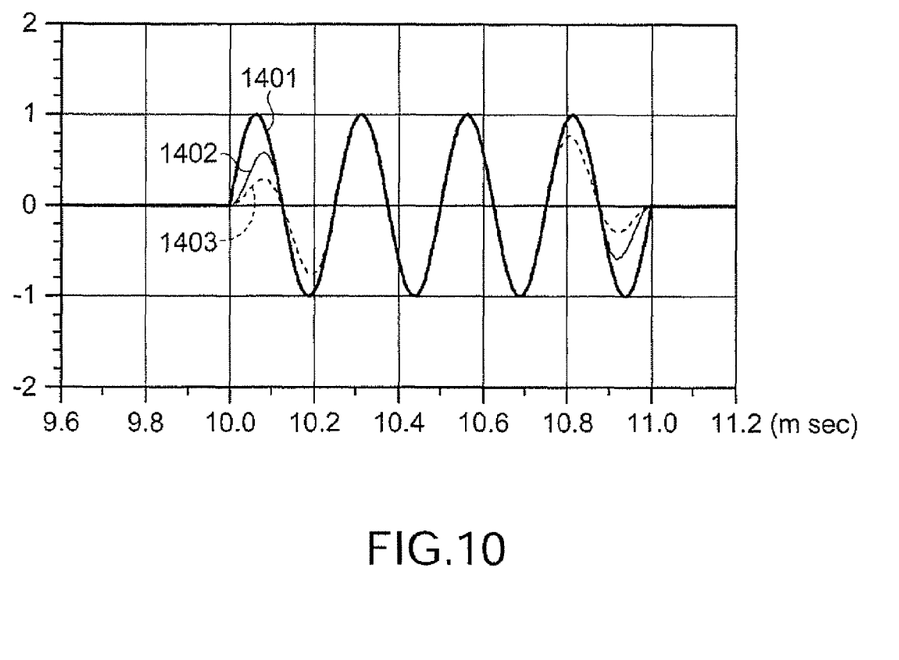
FIG. 10 shows graphs illustrating the waveforms of pulses generated in the present embodiment.

FIGS. 10 to 15 are graphs showing the waveforms obtained by band-limiting the waveforms shown in FIGS. 9E and 9G. The waveform 1401 in FIG. 10 is an example of the waveform in FIGS. 9E and 9G, which is not band-limited. To band-limit the waveform, the wave heights of the first and last pulses are lowered to round the pulse envelope. The waveform 1402 is obtained by setting the wave heights of the first and last pulse fingers to one-half the wave height of the original waveform. The waveform 1403 is obtained by setting the wave heights of the first and last fingers to one-third the wave height of the original waveform and setting the wave heights of the second and second last fingers to two-third the wave height of the original waveform.

Figure 11:
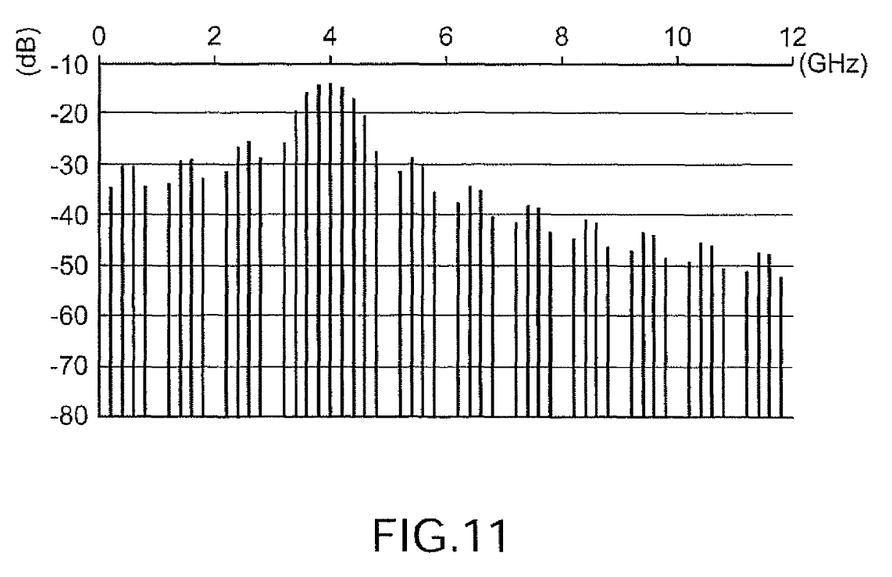
FIG. 11 is a graph showing the spectrum of the waveform of pulses generated in the present embodiment.
Figure 12:
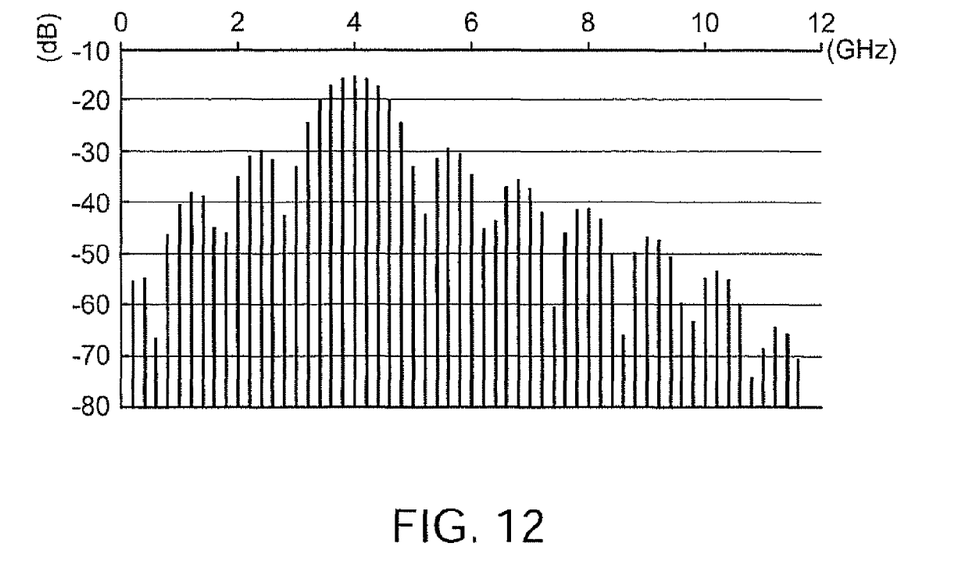
FIG. 12 is a graph showing the spectrum of the waveform of pulses generated in the present embodiment.
Figure 13:
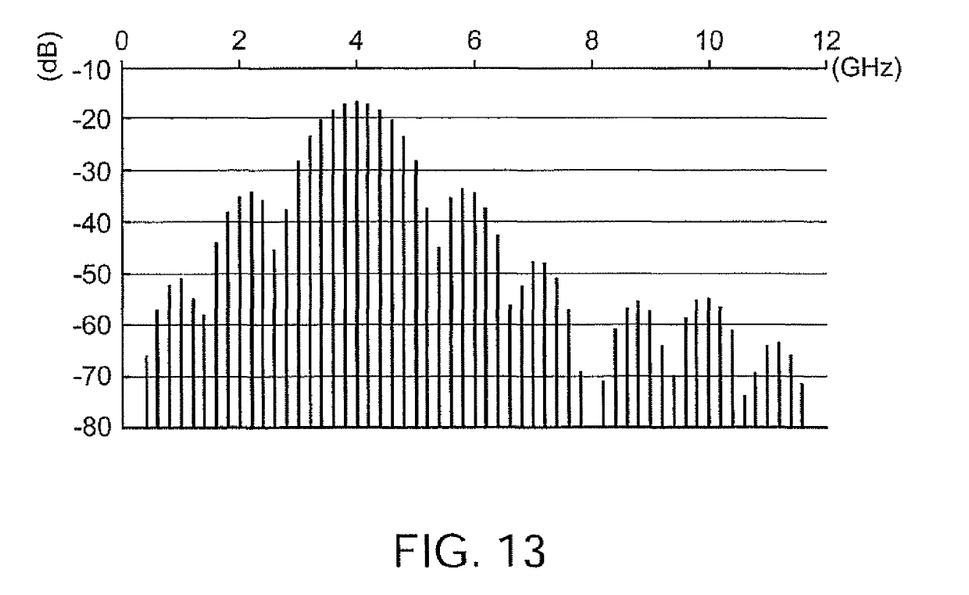
FIG. 13 is a graph showing the spectrum of the waveform of pulses generated in the present embodiment.

FIGS. 11 to 13 are graphs showing the spectra of the waveforms 1401 to 1403. FIG. 11 shows the spectrum of the waveform 1401 that has not been band-limited, and FIGS. 12 and 13 show the spectra of the waveforms 1402 and 1403 that have been band-limited. FIGS. 11 to 13 show respective single pulses shown in FIG. 10 repeated at a repetitive frequency of 200 MHz, which are line spectra at intervals of 200 MHz because no modulation is applied. Looking at how the spectra of the waveforms spread, one can see that the main lobes of the spectra of the waveforms 1402 and 1403 are slightly broader than that of the waveform 1401 that has not been band-limited, and the main lobe of the spectrum of the waveform 1403 is broader than that of the waveform 1402. The reason for this is that lowering the wave heights of the first and last pulses for band limitation equivalently shortens the pulse duration. Looking at the side lobes of the spectra, one can see that lowering the wave heights of the first and last pulses for band limitation is clearly effective. Although the difference at the first side lobe is only approximately several dB, the difference of several dB is valuable and very effective in configuring the system.

Figure 14:
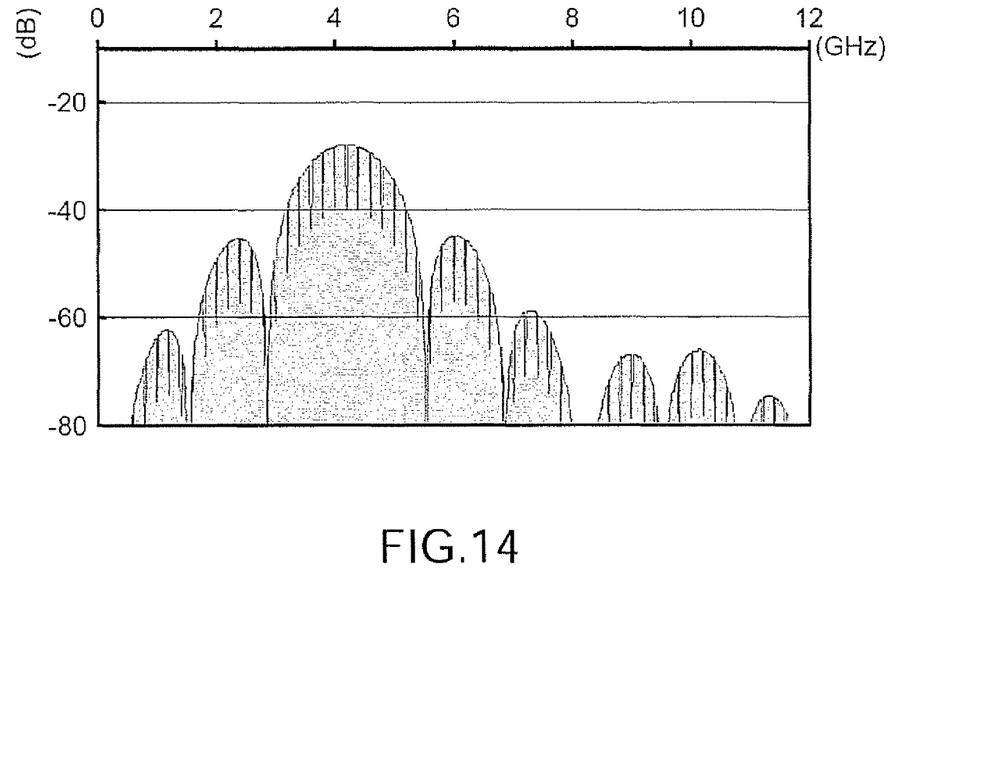
FIG. 14 is a graph showing the spectrum of the waveform of pulses generated in the present embodiment.
Figure 15:
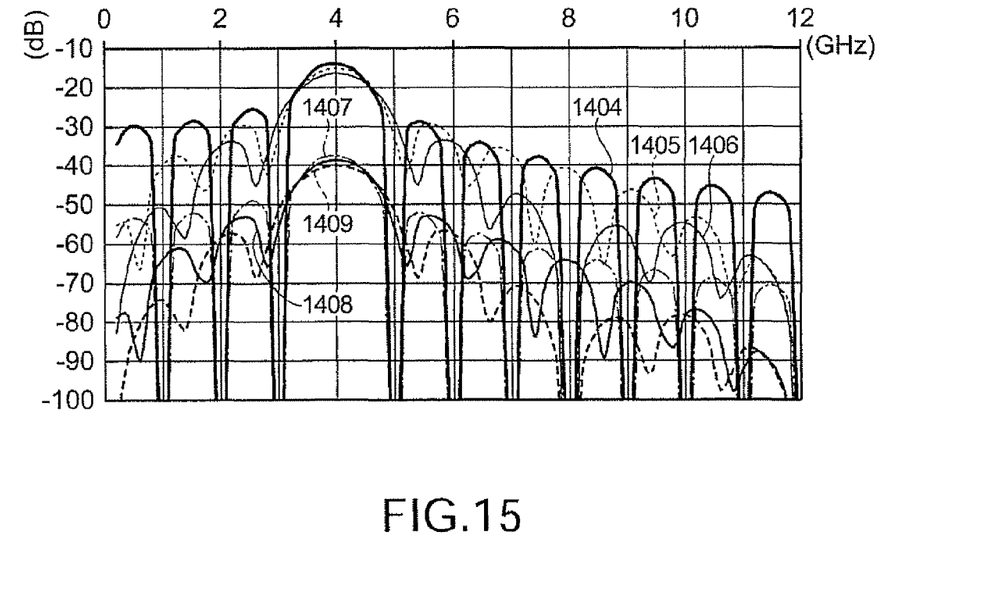
FIG. 15 shows graphs illustrating the spectra of the waveforms of pulses generated in the present embodiment.

FIGS. 11 to 13 show spectra when no modulation is applied. FIG. 14 is a graph showing the spectrum obtained by bi-phase modulating (BPM), by way of example, the waveform 1403 in accordance with a PN code having a length of 31. The modulation converts the line spectrum into a band spectrum and lowers the intensity of the spectrum. In practice, in the UWB communication, the acceptable upper limit of a spectrum is determined by legal regulations, and increase in spectrum intensity due to use of a line spectrum is not preferable. A measure is taken in actual use; for example, dithering is used to obtain a band spectrum. To understand band spectra obtained by dithering or any other suitable measure, FIG. 15 shows graphs illustrating the distributions of the spectra, by way of example, of the three waveforms described above, specifically, the spectra without modulation and the band spectra obtained by BPM using the PN code having a length of 31. FIG. 15 shows envelopes connecting only the peaks of the line spectra. In FIG. 15, the waveforms 1404, 1405, and 1406 are the envelopes of the spectra of the waveforms 1401, 1402, and 1403, respectively, shown in FIG. 10 when no modulation is applied thereto, and the waveforms 1407, 1408, and 1409 are band spectra of the waveforms 1401, 1402, and 1403, respectively, when modulation is applied thereto. It is found in each case that rounding the pulse envelope, that is, reducing the rate of envelope change at the first and last pulses, can reduce the side lobe of the spectrum.

Configuration of Pulse Generator Circuit

Figures 1A, 1B:
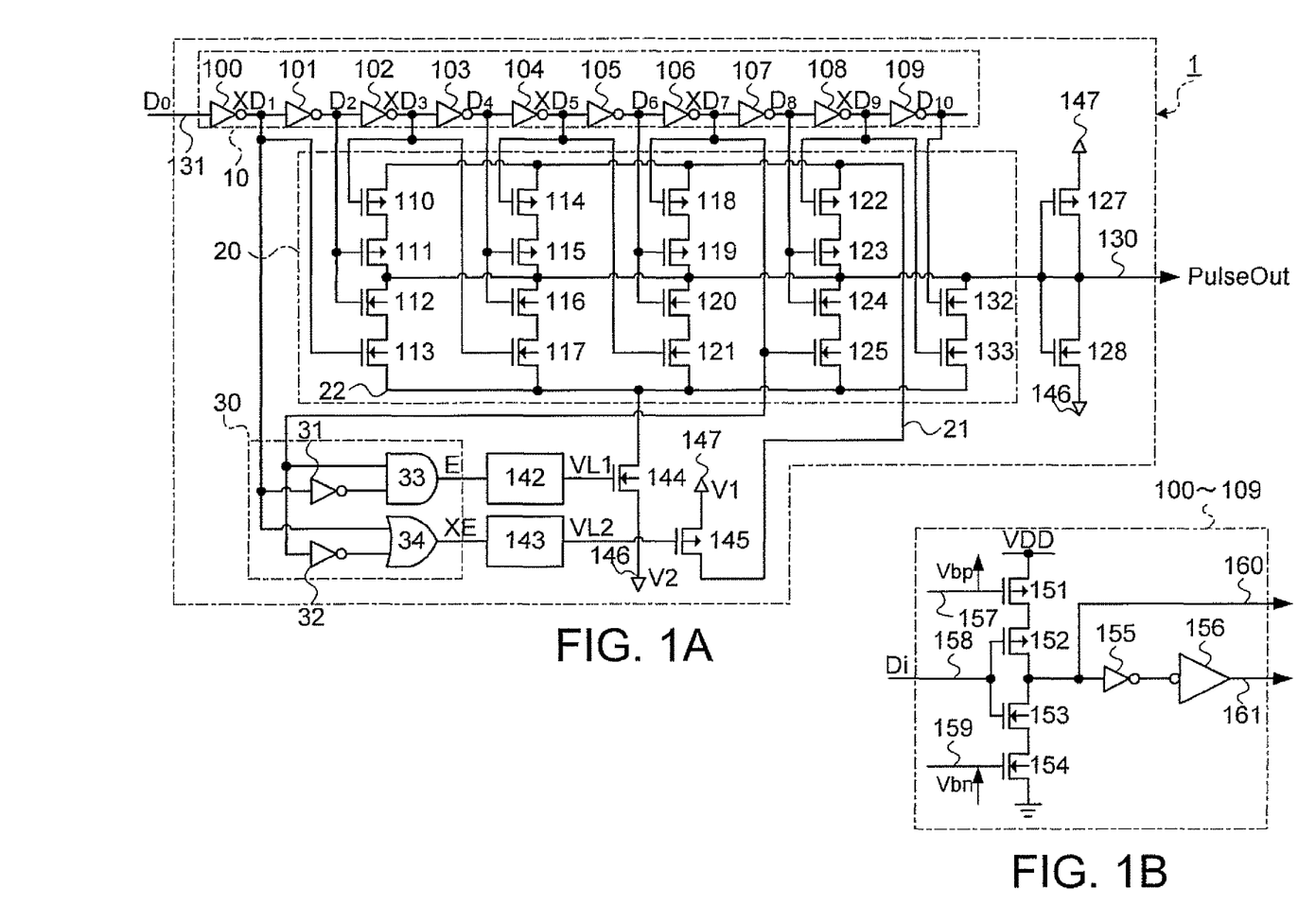
FIGS. 1A and 1B are circuit diagrams showing the configuration of a pulse generator circuit according to a first embodiment.
Figure 2:
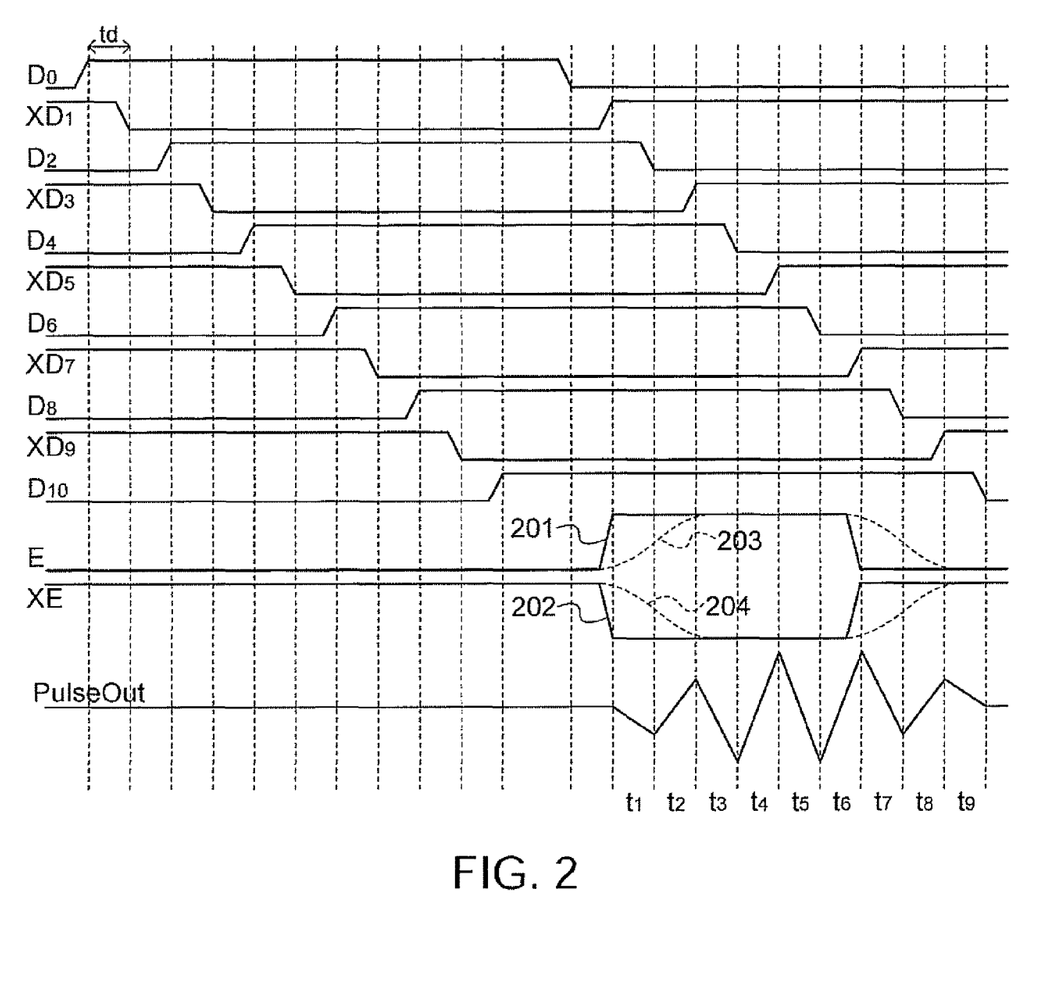
FIG. 2 is a timing chart showing the operation of the pulse generator circuit according to the first embodiment.

The pulse generator circuit will be described with reference to FIGS. 1A, 1B, and 2. FIGS. 1A and 1B are circuit diagrams showing the configuration of the pulse generator circuit. FIG. 2 is a timing chart showing the operation of the pulse generator circuit. As shown in FIG. 1A, the pulse generator circuit 1 includes a timing generator circuit 10, a pulse width signal generator circuit 30, a lowpass filter 142, which is a first filter circuit, a lowpass filter 143, which is a second filter circuit, a power supply line 147 to which a voltage V1, which is a first power supply, is applied, a power supply line 146 to which a voltage V2, which is a second power supply, is applied, an N-channel MOS transistor 144, which is a first variable impedance circuit, a P-channel MOS transistor 145, which is a second variable impedance circuit, and a switching circuit 20.

Configuration of Timing Generator Circuit

The timing generator circuit 10 includes inverter delay circuits 100 to 109 connected in tandem. The internal configuration of each of the inverter delay circuits 100 to 109 will be described with reference to FIG. 1B. A P-channel MOS transistor 152 and an N-channel MOS transistor 153 form an inverter circuit, and a signal inputted to a terminal 158 is inverted and delayed by a delay period td, outputted from a terminal 160, and inputted to the following inverter delay circuit. A small-buffer circuit 155 and a large-buffer circuit 156 are connected in series to the terminal 160 not to increase the amount of delay generated in the inverter circuit described above. A terminal 161 outputs a signal for driving the switching circuit 20. The small-buffer circuit 155 and the large-buffer circuit 156 are omitted in FIG. 1A.

An N-channel MOS transistor 154 is connected between the source of the N-channel MOS transistor 153 and a ground potential, and a P-channel MOS transistor 151 is connected between the source of the P-channel MOS transistor 152 and a power supply potential VDD. Controlling gate-source voltages Vbp and Vbn applied to the P-channel MOS transistor 151 and the N-channel MOS transistor 154 can control the power supply current flowing into the inverter circuit. Vbp and Vbn are typically controlled in such a way that the absolute values thereof are the same in order to maintain the symmetry between the rise and fall portions of the output from the inverter circuit. In this way, the operation speed of the inverter circuit and hence the delay period td can be controlled. To generate pulses having the target frequency spectrum, the voltages at terminals 157 and 159 may be controlled so that $P_W$=td is satisfied.

In FIG. 1A, the amount of delay generated in each of the inverter delay circuits 100 to 109 is adjusted to be equal to the carrier pulse width $P_W$ (=125 ps). When the amount of delay is equal to the carrier pulse width $P_W$, the target pulses described above, that is, pulses having a carrier frequency $f_0=4$ GHz (carrier pulse width: $P_W=125$ ps), can be generated. Since each of the inverter delay circuits 100 to 109 inverts and delays a pulse start signal $D_0$, which is a start signal, the outputs from the inverter delay circuits 100 to 109 are expressed as $XD_1, D_2, XD_3, D_4, XD_5, D_6, XD_7, D_8, XD_9$, and $D_{10}$, where the character X represents inversion and X is prefixed to the odd-numbered outputs.

That is, as shown in FIG. 2 as $XD_1$ to $D_{10}$ the pulse start signal $D_0$ inputted to an input terminal 131 propagates through the inverter delay circuits 100 to 109, each of which delays the signal by a delay period td and inverts the phase of the signal. The inverter delay circuits 100 to 109 thus output 10 (=n) signals $XD_1, D_2, XD_3, D_4, XD_5, D_6, XD_7, D_8, XD_9$, and $D_{10}$. That is, when the signal inputted to the input terminal 131 is a positive-logic signal, the (i−1)-th and i-th inverter delay circuits output $XD_{i-1}$ and $D_i$, respectively, where i represents an even number. The point where the phase of the pulse start signal $D_0$ is changed means the point where the pulse start signal $D_0$ is changed from H (high level) to L (low level) or from L to H.

Configuration of Switching Circuit

The switching circuit 20 includes P-channel MOS transistors 110, 111, 114, 115, 118, 119, 122, and 123 and N-channel MOS transistors 112, 113, 116, 117, 120, 121, 124, 125, 132, and 133. The P-channel MOS transistors 110, 111, and the N-channel MOS transistors 112, 113 are connected in series between a wired line 21 and a wired line 22. The P-channel MOS transistors 114, 115, and the N-channel MOS transistors 116, 117 are connected in series between the wired line 21 and the wired line 22. The P-channel MOS transistors 118, 119, and the N-channel MOS transistors 120, 121 are connected in series between the wired line 21 and the wired line 22. The P-channel MOS transistors 122, 123, and the N-channel MOS transistors 124, 125 are connected in series between the wired line 21 and the wired line 22.

The drain terminals of the P-channel MOS transistors 111, 115, 119, and 123 are connected to an output line 130. The N-channel MOS transistors 132 and 133 are connected in series between the output line 130 and the wired line 22. The signal $XD_1$ is inputted to the gate terminal of the N-channel MOS transistor 113. The signal $D_2$ is inputted to the gate terminals of the P-channel MOS transistor 111 and the N-channel MOS transistor 112. The signal $XD_3$ is inputted to the gate terminals of the P-channel MOS transistor 110 and the N-channel MOS transistor 117. The signal $D_4$ is inputted to the gate terminals of the P-channel MOS transistor 115 and the N-channel MOS transistor 116. The signal $XD_5$ is inputted to the gate terminals of the P-channel MOS transistor 114 and the N-channel MOS transistor 121. The signal $D_6$ is inputted to the gate terminals of the P-channel MOS transistor 119 and the N-channel MOS transistor 120. The signal $XD_7$ is inputted to the gate terminals of the P-channel MOS transistor 118 and the N-channel MOS transistor 125. The signal $D_8$ is inputted to the gate terminals of the P-channel MOS transistor 123 and the N-channel MOS transistor 124. The signal $XD_9$ is inputted to the gate terminals of the P-channel MOS transistor 122 and the N-channel MOS transistor 133. The signal $D_{10}$ is inputted to the gate terminal of the N-channel MOS transistor 132.

Configuration of Pulse Width Signal Generator Circuit

The pulse width signal generator circuit 30 includes inverters 31, 32, an AND circuit 33, and an OR circuit 34. The AND circuit 33, one input terminal of which receives the signal $XD_7$ and the other input terminal of which receives the signal $XD_1$ having passed through the inverter 31 and having been inverted, outputs the logical product E. The OR circuit 34, one input terminal of which receives the signal $XD_1$ and the other input terminal of which receives the signal $XD_7$ having passed through the inverter 32 and having been inverted, outputs the logical sum XE. The lowpass filter 142 receives the logical product E and outputs an output signal VL1 obtained by removing high-frequency components from the logical product E. The lowpass filter 143 receives the logical sum XE and outputs an output signal VL2 obtained by removing high-frequency components from the logical sum XE. The output signal VL1 is applied to the gate terminal of the N-channel MOS transistor 144 connected between the wired line 22 and the power supply line 146. The output signal VL2 is applied to the gate terminal of the P-channel MOS transistor 145 connected between the wired line 21 and the power supply line 147.

The pulse generator circuit 1 further includes a P-channel MOS transistor 127, the source terminal of which is connected to the power supply line 147 and the gate terminal and the drain terminal of which are connected to the output line 130, and an N-channel MOS transistor 128, the source terminal of which is connected to the power supply line 146 and the gate terminal and the drain terminal of which are connected to the output line 130.

Operation of Switching Circuit

The operation of the switching circuit 20 will be described below.

The N-channel MOS transistors 112 and 113 conduct current when $D_2$ and $XD_1$ are H, and connect the output line 130 to the power supply line 146 via the N-channel MOS transistor 144. That is, when $D_2$ AND $XD_1$ is true, the output line 130 is connected to the voltage V2 via the N-channel MOS transistor 144.

The P-channel MOS transistors 110 and 111 conduct current when $D_2$ and $XD_3$ are L, and connect the output line 130 to the power supply line 147 via the P-channel MOS transistor 145. That is, when $D_2$ OR $XD_3$ is false, the output line 130 is connected to the voltage V1 via the P-channel MOS transistor 145.

The N-channel MOS transistors 116 and 117 conduct current when $D_4$ and $XD_3$ are H, and connect the output line 130 to the power supply line 146 via the N-channel MOS transistor 144. That is, when $D_4$ AND $XD_3$ is true, the output line 130 is connected to the voltage V2 via the N-channel MOS transistor 144.

The P-channel MOS transistors 115 and 114 conduct current when $D_4$ and $XD_5$ are L, and connect the output line 130 to the power supply line 147 via the P-channel MOS transistor 145. That is, when $D_4$ OR $XD_5$ is false, the output line 130 is connected to the voltage V1 via the P-channel MOS transistor 145.

The N-channel MOS transistors 120 and 121 conduct current when $D_6$ and $XD_5$ are H, and connect the output line 130 to the power supply line 146 via the N-channel MOS transistor 144. That is, when $D_6$ AND $XD_5$ is true, the output line 130 is connected to the voltage V2 via the N-channel MOS transistor 144.

The P-channel MOS transistors 119 and 118 conduct current when $D_6$ and $XD_7$ are L, and connect the output line 130 to the power supply line 147 via the P-channel MOS transistor 145. That is, when $D_6$ OR $XD_7$ is false, the output line 130 is connected to the voltage V1 via the P-channel MOS transistor 145.

The N-channel MOS transistors 124 and 125 conduct current when $D_8$ and $XD_7$ are H, and connect the output line 130 to the power supply line 146 via the N-channel MOS transistor 144. That is, when $D_8$ AND $XD_7$ is true, the output line 130 is connected to the voltage V2 via the N-channel MOS transistor 144.

The P-channel MOS transistors 123 and 122 conduct current when $D_8$ and $XD_9$ are L, and connect the output line 130 to the power supply line 147 via the P-channel MOS transistor 145. That is, when $D_8$ OR $XD_9$ is false, the output line 130 is connected to the voltage V1 via the P-channel MOS transistor 145.

The N-channel MOS transistors 132 and 133 conduct current when $D_{10}$ and $XD_9$ are H, and connect the output line 130 to the power supply line 146 via the N-channel MOS transistor 144. That is, when $D_{10}$ AND $XD_9$ is true, the output line 130 is connected to the voltage V2 via the N-channel MOS transistor 144.

Each of the P-channel MOS transistor 127 and the N-channel transistor 128 is a MOS resistor. They divide potentials applied to the power supply lines 147 and 146 and set the potential at the output line 130 (pulse waveform PulseOut) when the switching circuit 20 is connected to neither the voltage V1 nor the voltage V2.

In the operation described above, the output line 130 is switched between the voltage V1 via the N-channel MOS transistor 144 and the voltage V2 via the P-channel MOS transistor 145 whenever the delay period td elapses. Let $t_{i-1}$ be a period during which $D_i$ AND $XD_{i-1}$ is true, and $t_i$ be a period during which $D_i$ OR $XD_{i-1}$ is false. The output line 130 is connected to the voltage V2 via the N-channel MOS transistor 144 during the period $t_{i-1}$, while connected to the voltage V1 via the P-channel MOS transistor 145 during the period $t_i$, as indicated by the waveform PulseOut in FIG. 2.

Therefore, the N-channel MOS transistor 144 and the P-channel MOS transistor 145 limit the output driving capability of the voltages V1 and V2, and adjusting the ON resistance of the N-channel MOS transistor 144 and the P-channel MOS transistor 145 allows the envelope of the outputted pulse waveform PulseOut to be arbitrarily set. The outputted pulse waveform PulseOut depends on the value of a load connected to the output and the driving capability limited by the N-channel MOS transistor 144 and the P-channel MOS transistor 145. When the load contains a capacitance component, in particular, the output pulses are integrated and the resultant waveform is close to that of a triangular wave having different wave heights, like the pulse waveform PulseOut shown in FIG. 2.

Each of the N-channel MOS transistor 144 and the P-channel MOS transistor 145 operates as a variable impedance device, and is controlled by the voltage applied to the gate thereof. The voltages applied to the gates are the logical product E (the waveform 201 in FIG. 2) and the logical sum XE (the waveform 202 in FIG. 2) generated by the pulse width signal generator circuit 30, which generates pulses each of which having a pulse width that corresponds to the duration of each output pulse. The logical product E and the logical sum XE are band-limited by the lowpass filters 142 and 143, respectively, and the output signals VL1 and VL2 (the waveforms 203 and 204 in FIG. 2) from the lowpass filters 142 and 143 are applied to the gates of the N-channel MOS transistor 144 and the P-channel MOS transistor 145.

When the waveforms in accordance with which the N-channel MOS transistor 144 and the P-channel MOS transistor 145, which are variable impedance devices, are controlled and set to be the envelopes of band-limited pulse waveforms in accordance with the principle described above, the generated pulses are automatically band-limited. In the configuration described above, the generated pulses have a spectrum obtained by folding the frequency response characteristics of the lowpass filters 142 and 143 along the carrier frequency $f_0$. The spectrum of the generated pulses can therefore be freely adjusted in accordance with the design of the lowpass filters 142 and 143. Since the design is arbitrarily determined, the wave heights of the first and last output pulses are not necessarily lowered unlike FIG. 10, but the spectral characteristics can be freely set. Since the band characteristics of a given target spectrum allows the characteristics of the lowpass filters 142 and 143 to be designed, desired band characteristics can be obtained in accordance with the design. Alternatively, when the characteristics are determined to follow a Gaussian function, the spread of the pulses along the temporal axis and the spread of the pulses along the frequency axis, that is, the two band spreads (multiplication of the two band spreads), can be theoretically minimized. It is noted that E, XE, and PulseOut are enlarged in the amplitude direction in FIG. 2 so that the waveforms are clearly shown.

The logical product E and the logical sum XE have phases inverted from each other, and the pulse width of which corresponds to the pulse width $P_D$ Of the generated pulses. When the lowpass filters 142 and 143 produce delay in association with their operation, the position of the tap of each of the inverter delay circuits 101 to 109 is moved forward to adjust the timing. The width of each of the logical product E and the logical sum XE is, to be exact, the portion of $P_D$ that is other than the tailing period resulting from the response of the corresponding one of the lowpass filters 142 and 143. In FIG. 2, the waveforms 203 and 204 are the outputs from the lowpass filters 142 and 143, that is, the voltages V1 and V2 applied to the gates of the transistors 144 and 145. Multiplying the waveforms 203 and 204 by the carrier having the carrier frequency $f_0$ provides a signal the frequency band of which has a width $f_{LPF}$ on the upper and lower sides of $f_0$, where $f_{LPF}$ represents the pass band width of the lowpass filters 142 and 143. Further, the envelope of the output pulse waveform PulseOut is equal to each of the waveforms 203 and 204 produced by the lowpass filters 142 and 143.

According to related art, output pulses pass a bandpass filter so that generated pulses are band-limited. In the present embodiment, no bandpass filter is used, but the lowpass filters 142 and 143, which are readily designed, are used. Further, the frequencies handled by the lowpass filters 142 and 143 are much lower than the pass band of the bandpass filter used in related art. This fact also allows the filter to be more readily designed, implemented, and manufactured. Moreover, since the voltages V1 and V2 band-limited by the lowpass filters 142 and 143 are multiplied by the carrier having the frequency 1/(2×td), accurate pulses having a spectral distribution symmetric with respect to the carrier frequency described above can be generated.

The present embodiment described above can provide the following advantageous effects:

In the present embodiment, a circuit as simple as the circuit of related art can generate pulses that have undergone necessary band limitation and have an arbitrary length of duration. The generated pulses, even when they are high-frequency, high-speed pulses close to the operation limit of the devices in the circuit, can be precise and well characterized.

Second Embodiment

A second embodiment of the pulse generator circuit will be described below with reference to FIGS. 3 and 4.

Figure 3:
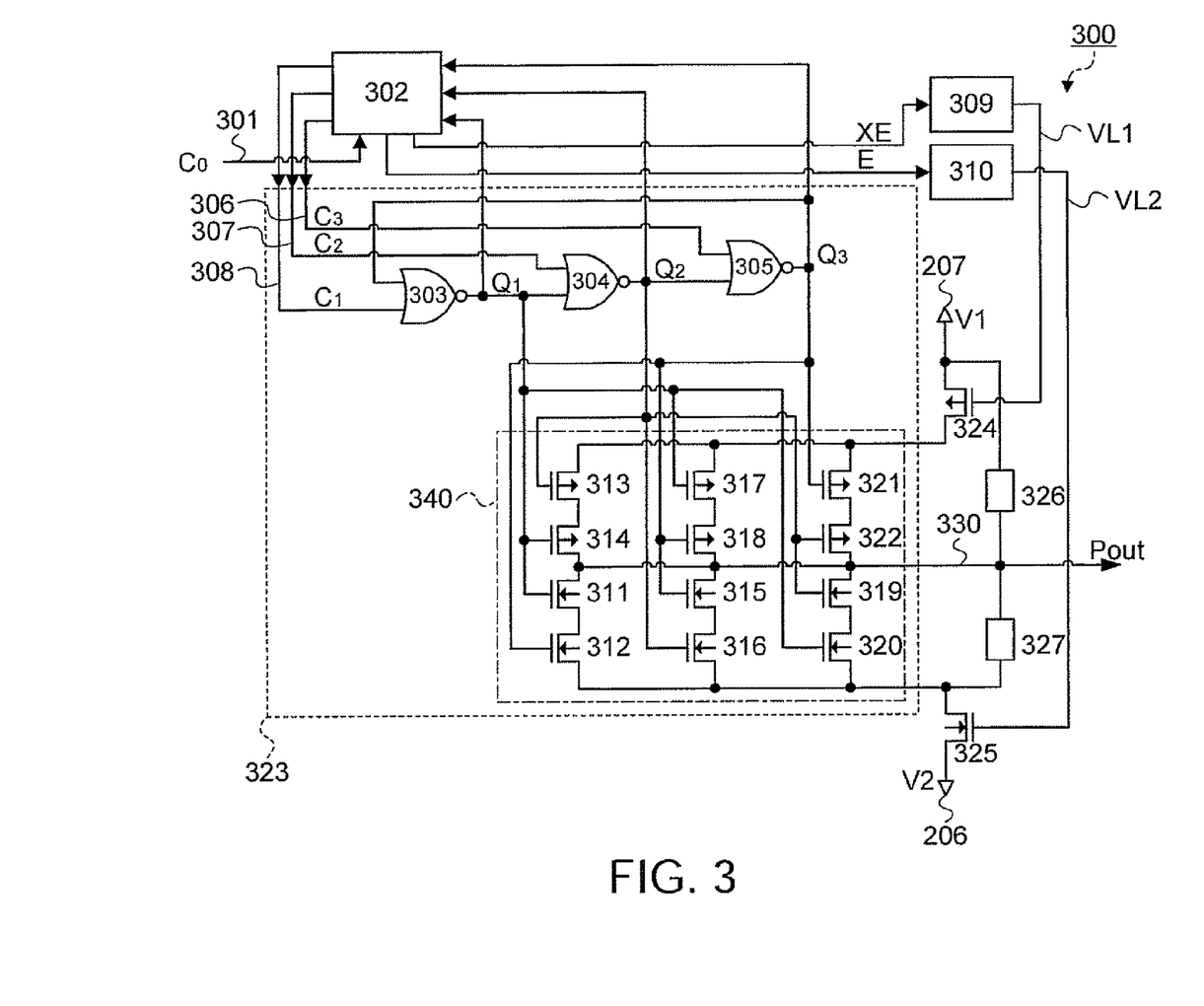
FIG. 3 is a circuit diagram showing the configuration of a pulse generator circuit according to a second embodiment.

FIG. 3 is a circuit diagram showing the configuration of a pulse generator circuit 300 according to the second embodiment. FIG. 4 is a timing chart showing the operation of the pulse generator circuit 300 according to the second embodiment.

In FIG. 3, each of NOR circuits 303, 304, and 305 is an NOR-logic delay circuit. Let $Q_1$, $Q_2$, and $Q_3$ be the outputs from the NOR circuits 303, 304, and 305. One of the two input terminals of each of the NOR circuits 303, 304, and 305 is connected to the corresponding one of the outputs $Q_3$, $Q_1$, and $Q_2$ from the NOR circuits 305, 303, and 304 so as to form a ring oscillator circuit. Let $C_1$, $C_2$, and $C_3$ be the other input terminals 308, 307, and 306 of the NOR circuits 303, 304, and 305.

When $(Q_1+Q_2) \times (Q_3+Q_1) \times (Q_2+Q_3)$ is false, a pulse output terminal Pout 330 of a switching circuit 340 is connected to a power supply of a voltage V1 via a P-channel MOS transistor 324. The gate of the P-channel MOS transistor 324 is connected to an output signal VL1 from a lowpass filter 309. When $Q_3 \times Q_1 + Q_2 \times Q_3 + Q_1 \times Q_2$ is true, the pulse output terminal Pout 330 is connected to a power supply of a voltage V2 via an N-channel MOS transistor 325. The gate of the N-channel MOS transistor 325 is connected to an output signal VL2 from a lowpass filter 310.

In FIG. 3, the portion surrounded by the dotted line 323 works in the same manner even when the names $(Q_1, Q_2, Q_3)$ and $(C_1, C_2, C_3)$ are changed to $(Q_2, Q_3, Q_1)$ and $(C_2, C_3, C_1)$. Such a circuit is called a cyclically symmetric circuit in the present embodiment. Further, when the input and output values of a logic circuit are represented by true (H) and false (L), the logical values of the circuit can be abbreviated as, for example, $(Q_1, Q_2, Q_3)$=(H, L, L), which means that $Q_1$=H, $Q_2$=L, and $Q_3$=L.

Figure 4:
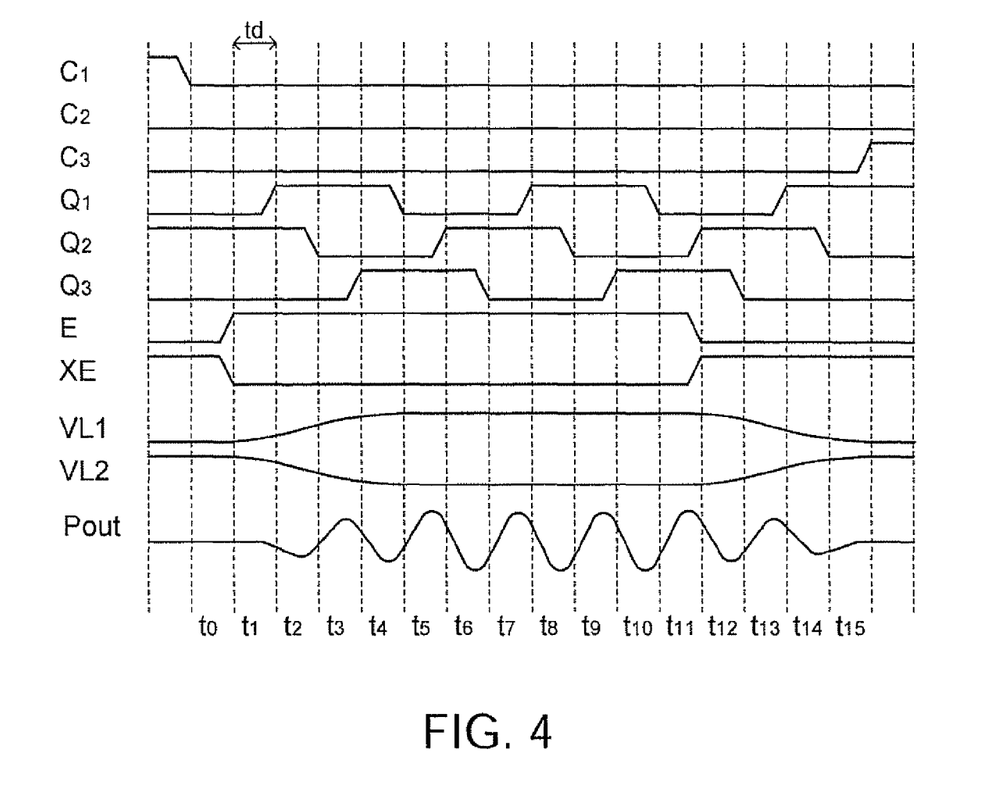
FIG. 4 is a timing chart showing the operation of the pulse generator circuit according to the second embodiment.

P-channel MOS transistors 317 and 318 conduct current when $(C_1, C_2, C_3)$=(H, L, L) and hence $(Q_1, Q_2, Q_3)$=(L, H, L), and the pulse output terminal Pout 330 is connected to a power supply line 207 (voltage V1) via the P-channel MOS transistor 324 (period $t_0$ in FIG. 4). When the state transits to $(C_1, C_2, C_3)$=(L, L, L) (period $t_1$ in FIG. 4), the NOR circuits 303 to 305 become equivalent to a three-inverter ring oscillator circuit, which then starts oscillating. During a period in which the ring oscillator circuit formed of the NOR circuits 303 to 305 keeps oscillating, the switching circuit 340 operates in accordance with the logic described above. The pulse output terminal Pout 330 is therefore alternately switched to the power supply line 207 (via the P-channel MOS transistor 324) and a power supply line 206 (voltage V2) (via the N-channel MOS transistor 325) whenever a delay period td generated in each of the NOR circuits 303 to 305 elapses. The target pulses are thus generated.

In practice, since the switching circuit 340 performs switching in a very short period, the switching is finished before load capacitance and stray capacitance are sufficiently charged. Therefore, a square-cornered waveform, such as PulseOut schematically shown in FIG. 2, will not be provided, but a rounded waveform, such as the one shown in FIG. 4, will be outputted. FIG. 4 shows a more realistic waveform.

Subsequently, when any one of $(C_1, C_2, C_3)$ is set to H, the ring oscillator circuit formed of the NOR circuits 303 to 305 stops oscillating and hence stops outputting pulses. In this process, any pair of the P-channel MOS transistors 313 and 314, 317 and 318, and 321 and 322 simultaneously conduct current and stops outputting pulses (period $t_{15}$ in FIG. 4).

In the operation described above, the pulse generator circuit 300 can generate pulses having an arbitrary length of duration.

In the stationary state described above, any pair of the P-channel MOS transistors 313 and 314, 317 and 318, and 321 and 322 simultaneously conduct current. In this state, the potential at the pulse output terminal Pout 330 is not the voltage V1, but can be set to an intermediate value between the voltage V1 and the voltage V2 by using the P-channel MOS transistor 324 and the N-channel MOS transistor 325, which control the output pulse envelope.

A control method for band-limiting the output pulses will now be described.

A control circuit 302 generates complementary signals E and XE shown in FIG. 4, which correspond to the pulse width. The signals E and XE pass through the lowpass filters 310 and 309 and become the output signals VL1 and VL2. The output signals VL1 and VL2, which control the pulse envelope, are applied to the gates of the P-channel MOS transistor 324 and the N-channel MOS transistor 325. The current flowing into the switching circuit 340 is then controlled in accordance with the switching timing, and the envelope of the output pulses is controlled accordingly. Since the output signals VL1 and VL2, which control the envelope of the output pulses, are band-limited by the lowpass filters 309 and 310, the output pulses also form a signal having a band twice the value $f_{LPF}$, the central value of the band being the carrier frequency $f_0$.

As shown in FIG. 4, since the P-channel MOS transistor 324 and the N-channel MOS transistor 325 are OFF in the stationary state (before the period $t_0$ and after the period $t_{15}$ in FIG. 4), the pulse output terminal Pout 330 is connected to neither the voltage V1 nor V2 via the switching circuit 340. Impedance devices 326 and 327 divide the voltages V1 and V2 and set the potential in the stationary state. When the values of the impedance devices 326 and 327 are equal to each other, the potential in the stationary state can be set to a middle value between the voltage V1 and the voltage V2.

The control circuit 302 receives a pulse start signal $C_0$ inputted to a start signal terminal 301 and sets $(C_1, C_2, C_3)$ to (L, L, L) in order to start pulse generation. The ring oscillator circuit formed of the NOR circuits 303 to 305 therefore starts oscillation and generates pulses. When the length of the pulses becomes a predetermined value, the control circuit 302 outputs a signal to $(C_1, C_2, C_3)$ again to stop the oscillation of the ring oscillator circuit formed of the NOR circuits 303 to 305 and hence stop pulse generation. At the same time, the control circuit 302 outputs the signals E and XE, the time width of which corresponds to the pulse duration, to the lowpass filters 309 and 310. To compensate the delay period associated with the outputs from the lowpass filters 310 and 309 and the response period (tailing) at the trailing edge of the pulses, the signals E and XE may be produced earlier by the delay period.

Pulses are generated when $(C_1, C_2, C_3)$ are (L, L, L), otherwise no pulse is generated. One may therefore consider that there are many degrees of freedom in the control of $(C_1, C_2, C_3)$, but there are not. When any one of the terminals $(C_1, C_2, C_3)$ is used to control the circuit, the number of pulse fingers is limited to a multiple of three when the three-stage ring oscillator circuit is formed as in the present embodiment.

Now, assume that the control circuit 302 outputs (H, L, L) to $(C_1, C_2, C_3)$ as an initial value. In this case, $(Q_1, Q_2, Q_3)$=(L, H, L). When the pulse start signal $C_0$ is inputted to the start signal terminal 301 in this state, the control circuit 302 produces (L, L, L) to $(C_1, C_2, C_3)$.

As a result, the ring oscillator circuit formed of the NOR circuits 303 to 305 starts oscillating and hence starts outputting pulses from the pulse output terminal Pout 330. To obtain pulses formed of a desired number of fingers, the control circuit 302 sends signals to $(C_1, C_2, C_3)$. That is, as shown in FIG. 4, to generate pulses formed of fingers the number of which is, for example, 3n+1 (n is an integer), the control circuit 302 monitors $Q_1$, $Q_2$, and $Q_3$, and when $Q_3$ becomes L, the control circuit 302 outputs (L, L, H) to ($C_1$, $C_2$, $C_3$) to terminate the pulse generation.

The control circuit 302 holds this state and waits for the next pulse start signal $C_0$ inputted to the start signal terminal 301. In this case, the control circuit 302 waits for the pulse start signal $C_0$ in the state ($C_1$, $C_2$, $C_3$)=(L, L, H), whereas in the initial state described above, the control circuit 302 waits for $C_0$ in the state ($C_1$, $C_2$, $C_3$)=(H, L, L). Since the pulse generator circuit 300 is a cyclically symmetric circuit, $C_1$, $C_2$, and $C_3$ are changed to $C_2$, $C_3$, and $C_1$ and the same operation follows.

That is, when the next $C_0$ is inputted in this state, the control circuit 302 can generate pulses formed of the same number of pulse fingers by outputting (L, L, L) to ($C_1$, $C_2$, $C_3$) to start pulse generation and outputting (L, H, L) to ($C_1$, $C_2$, $C_3$), when $Q_1$ becomes L, to terminate the pulse generation.

Thus using the fact that the circuit is symmetric allows the control to be easier, and the control circuit 302 can be readily designed in consideration of the cyclic symmetry.

The present embodiment described above can provide the following advantageous effects:

The present embodiment allows a band-limited UWB pulse signal having an arbitrary length of duration to be generated in a simple circuit.

Third Embodiment

A third embodiment of the pulse generator circuit will be described below.

FIGS. 5 to 8 explain key portions of a communication apparatus using the pulse generator circuit 1 of the first embodiment or the pulse generator circuit 300 of the second embodiment, and show cases where the pulse generator circuit 1 or the pulse generator circuit 300 is applied to a UWB transmitter and a UWB receiver.

Figure 5:
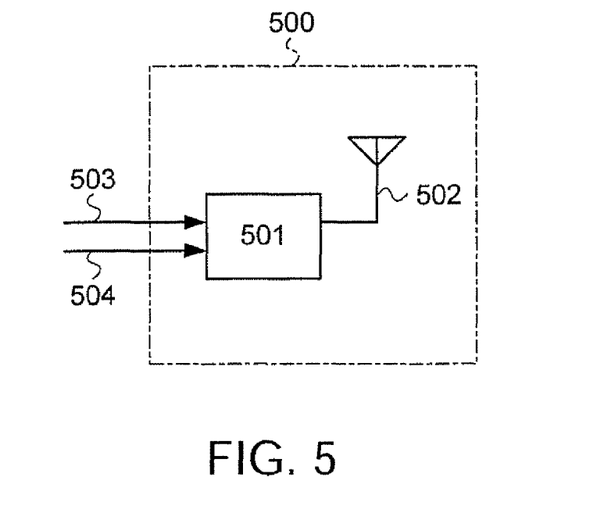
FIG. 5 is a circuit diagram showing the configuration of a UWB communication apparatus according to a third embodiment.

FIG. 5 is a block diagram schematically showing a UWB-IR transmitter 500. A pulse generator circuit 501 is comprised of the pulse generator circuit 1 (FIG. 1A) or the pulse generator circuit 300 (FIG. 3). An input terminal 503 is a terminal to which a start signal is inputted, and an input terminal 504 is a terminal to which data to be transmitted are inputted. The generated pulses are modulated in accordance with the signal inputted to the input terminal 504, and the modulation method will be described later. The thus generated pulses are transmitted via an antenna 502.

Examples of the modulation method may include pulse bi-phase modulation (BPM) in which modulation is carried out by switching the polarity of output pulses in accordance with the value of transmission data inputted to the input terminal 504, and pulse position modulation (PPM) in which a start signal is connected to a delay circuit and the delay period of the start signal is switched in accordance with transmission data.

Figure 7:
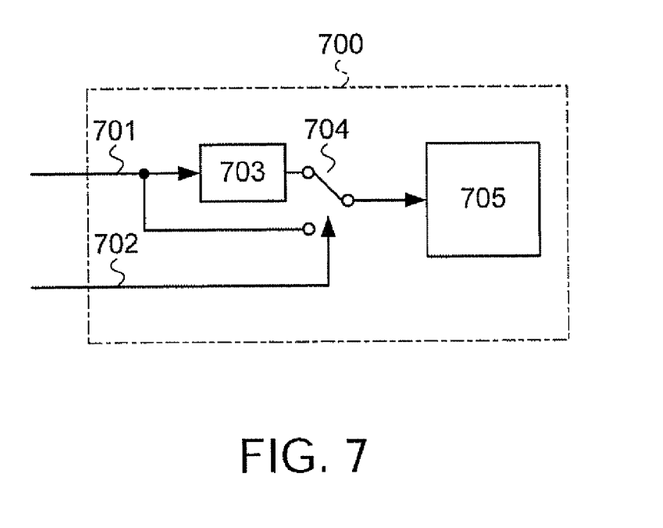
FIG. 7 is a circuit diagram showing the configuration of a UWB communication apparatus according to the third embodiment.

FIG. 7 shows a PPM modulator circuit 700. An input terminal 701 is a terminal to which the start signal is inputted. A signal delayed from the start signal by using a delay circuit 703 and a non-delayed signal that has not passed through the delay circuit 703, the original signal, are generated. A switch 704 chooses either of the two signals, and the chosen signal is inputted to a pulse generator circuit 705. Choosing the signal that has passed through the delay circuit 703 or the signal that has not passed therethrough based on the bit value (1 or 0) of transmission data inputted to an input terminal 702 allows the start signal delay period generated in the delay circuit to shift in accordance with the value of the transmission data for PPM modulation.

Figure 8:
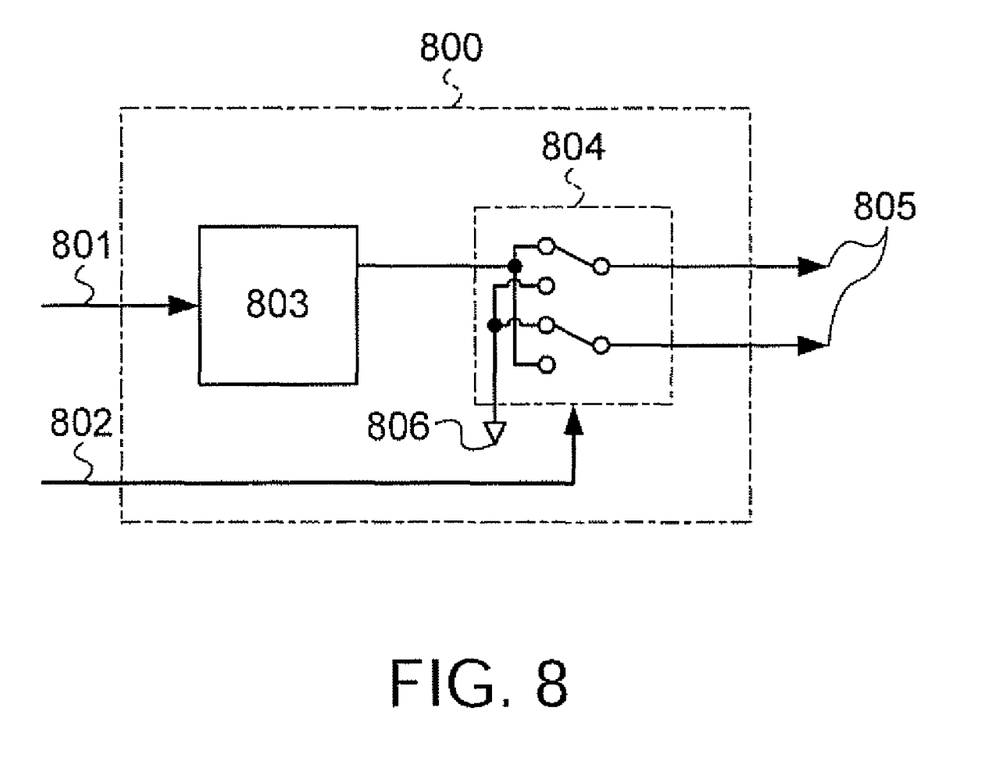
FIG. 8 is a circuit diagram showing the configuration of a UWB communication apparatus according to the third embodiment.

FIG. 8 shows a BPM modulator circuit 800 using BPM as the modulation method. A pulse start signal inputted to an input terminal 801 is inputted to a start terminal of a pulse generator circuit 803. The pulse generator circuit 803 can be the pulse generator circuit 1 or the pulse generator circuit 300. The polarity of the pulses generated by the pulse generator circuit 803 is inverted by using a switch 804 to switch the connection between the output terminal of the pulse generator circuit 803 and a predetermined potential applied to a terminal 806 based on transmission data applied to an input terminal 802. The operation described above allows BPM-modulated pulses to be supplied from output terminals 805. The predetermined potential applied to the terminal 806 is desirably an intermediate potential between the voltages V1 and V2 described in the above embodiment, but the power supply potential, ground potential, or any other arbitrary potential can be used because the antenna radiates no DC component.

Like the present embodiment, using the present pulse generator circuit as the pulse generator circuit in the UWB-IR transmitter 500 can reduce adverse effects on other portions without using a special filter or other components because the generated pulses have a small spectral spread and a low-level side lobe.

Figure 6:
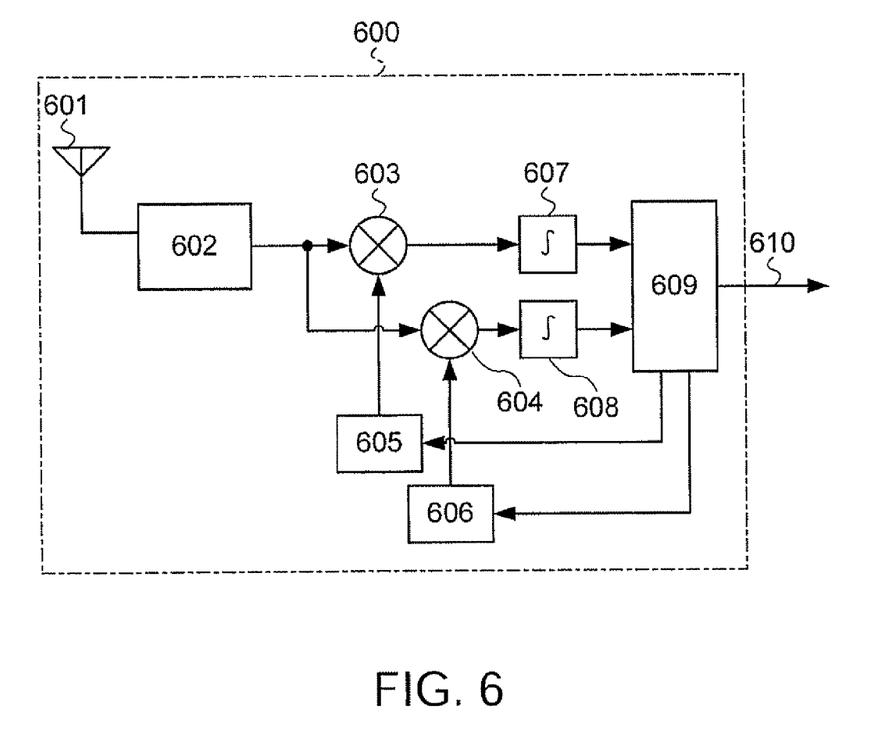
FIG. 6 is a circuit diagram showing the configuration of a UWB communication apparatus according to the third embodiment.

FIG. 6 is a block diagram showing a UWB receiver 600 using the pulse generator circuit 1 of the first embodiment or the pulse generator circuit 300 of the second embodiment. A UWB pulse signal received by a receiver antenna 601 is amplified by a low-noise amplifier circuit 602 and inputted to I/Q mixer circuits 603 and 604. The mixer circuits 603 and 604 multiply the amplified UWB pulse signal by template pulses generated by template pulse generator circuits 605 and 606, and send the resultant signals to integrator circuits 607 and 608. The integrator circuits 607 and 608 remove high-frequency components in the signals that have undergone the mixing (multiplication) in the mixer circuits 603 and 604 and calculate correlation values. A discriminator circuit 609 examines the intensities of the signals to judge the transmitted bits, returns them to the original transmission data, and outputs the transmission data from an output terminal 610.

Each of the template pulse generator circuits 605 and 606 can be the pulse generator circuit 1 of the first embodiment or the pulse generator circuit 300 of the second embodiment. Further, use of IQ template pulses having phases different from each other by 90 degrees allows efficient reception even in BPM or PPM. That is, in BPM or PPM, it is possible, for example, to use the I phase for data demodulation and the Q phase for tracking. Specifically, adjusting the template generation timing in such a way that the Q-phase output is always zero allows the I-phase output amplitude to be maximized, whereby such control allows synchronous detection tracking. As shown in FIG. 6, the two template pulse generator circuits 605 and 606 are used to generate start pulses having phases different from each other by 90 degrees to start the two template pulse generator circuits 605 and 606. IQ template pulses can thus be generated.

One may consider that the template pulses generated by the template pulse generator circuits 605 and 606 in the UWB receiver 600 are not necessarily band-limited because no energy radiation into space is intended. However, since the template pulses most highly correlate with the pulses used in a UWB-IR transmitter when their waveforms are the same, the template pulse generator circuits 605 and 606 in the UWB receiver 600 should ideally be the same as the circuit used in the UWB-IR transmitter. It is needless to say that the configuration described above is significantly effective in reducing spurious radiation, which is a problem in many receivers.

The present pulse generator circuit can generate pulses that do not contain unnecessary band components and have an arbitrary length of duration by using simple circuitry. The present pulse generator circuit also consumes less power. Using the present pulse generator circuit in a UWB communication apparatus therefore allows a high-performance apparatus to be achieved.

When a CMOS integrated circuit is used to achieve the present pulse generator circuit, power is consumed only during the transition period in pulse generation, whereby there is not what is called idling current. When the pulse generator circuit described above is used in a communication apparatus, the communication apparatus can always operate at minimum power consumption according to the amount of information to be transmitted (bit rate).

While some embodiments of the pulse generator circuit have been described, the pulse generator circuit is not at all limited thereto, but can be implemented in a variety of forms to the extent that they do not depart from the spirit of the invention.

First Modification

Figure 16:
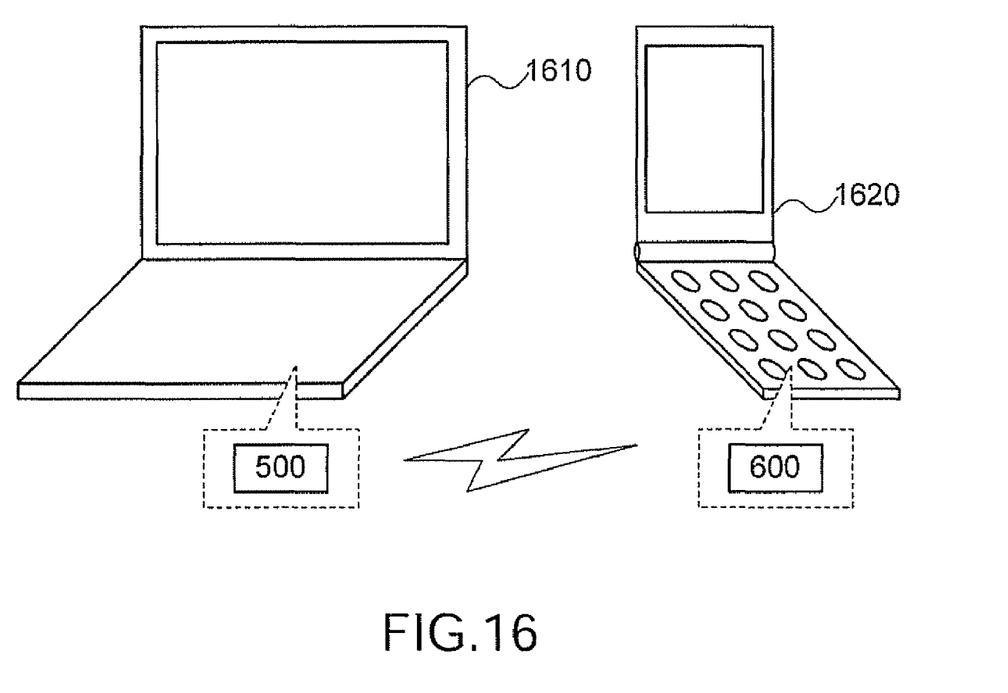
FIG. 16 is a schematic view showing the configuration of electronic apparatus according to a first modification.

An example of an electronic apparatus using a pulse generator circuit will be described. FIG. 16 is a schematic view showing the configuration of a notebook PC (Personal Computer) 1610 and a mobile phone 1620 as the electronic apparatus according to a first modification. The notebook PC 1610 has the UWB-IR transmitter 500 described in the third embodiment built therein, and mobile phone 1620 has the UWB receiver 600 described in the third embodiment built therein. The notebook PC 1610 can transmit information data from the UWB-IR transmitter 500, and the mobile phone 1620 can receive the information data by using the UWB receiver 600.

The entire disclosure of Japanese Patent Applications Nos: 2008-051707, filed Mar. 3, 2008 and 2009-000064 filed Jan. 5, 2009 are expressly incorporated by reference herein.

What is claimed is:

1. A pulse generator circuit that outputs pulses having a predetermined shape from an output terminal based on a start signal, the pulse generator circuit comprising:
   a timing generator circuit that generates (n) signals (n is an integer greater than or equal to 2), the phases of which sequentially change at predetermined time intervals from the point when the phase of the start signal changes;
   a pulse width signal generator circuit that generates a first pulse width signal and a second pulse width signal having a pulse width that corresponds to the duration of the pulses to be generated based on the start signal;
   a first filter circuit to which the first pulse width signal is inputted, the first filter circuit limiting the band of the first pulse width signal;
   a second filter circuit to which the second pulse width signal is inputted, the second filter circuit limiting the band of the second pulse width signal;
   first and second power supplies that supply predetermined potentials;
   a first variable impedance circuit whose impedance value is controlled by the output value from the first filter circuit;
   a second variable impedance circuit whose impedance value is controlled by the output value from the second filter circuit; and
   a switching circuit that alternately connects the output terminal to the first power supply via the first variable impedance circuit or the second power supply via the second variable impedance circuit using a logic function value based on at least part of the n signals.

2. The pulse generator circuit according to claim 1, wherein the timing generator circuit includes delay circuits connected in tandem, each of the delay circuits generating a predetermined amount of delay.

3. The pulse generator circuit according to claim 1, wherein the timing generator circuit is comprised of a ring oscillator circuit at least part of which including a delay circuit that generates a predetermined amount of delay.

4. The pulse generator circuit according to claim 1, wherein the first variable impedance circuit is comprised of a transistor controlled by the output value from the first filter circuit, and the second variable impedance circuit is comprised of a transistor controlled by the output value from the second filter circuit.

5. A communication apparatus comprising the pulse generator circuit according to claim 1.

* * * * *